(12) United States Patent
Kato et al.

(10) Patent No.: US 11,136,669 B2
(45) Date of Patent: Oct. 5, 2021

(54) FILM FORMATION APPARATUS

(71) Applicant: TOKYO ELECTRON LIMITED, Tokyo (JP)

(72) Inventors: Hitoshi Kato, Iwate (JP); Takeshi Kobayashi, Iwate (JP); Toshiyuki Nakatsubo, Iwate (JP)

(73) Assignee: TOKYO ELECTRON LIMIIED, Tokyo (JP)

( * ) Notice: Subject to any disclaimer, the term of this patent is extended or adjusted under 35 U.S.C. 154(b) by 182 days.

(21) Appl. No.: 16/225,788

(22) Filed: Dec. 19, 2018

(65) Prior Publication Data

US 2019/0186004 A1 Jun. 20, 2019

(30) Foreign Application Priority Data

Dec. 20, 2017 (JP) .............................. JP2017-244303

(51) Int. Cl.
| | |
|---|---|
| *C23C 16/458* | (2006.01) |
| *C23C 14/54* | (2006.01) |
| *H01L 21/683* | (2006.01) |
| *C23C 16/455* | (2006.01) |
| *H01L 21/687* | (2006.01) |

(52) U.S. Cl.
CPC ........ *C23C 16/4584* (2013.01); *C23C 14/541* (2013.01); *C23C 16/45544* (2013.01); *C23C 16/45578* (2013.01); *H01L 21/6838* (2013.01); *H01L 21/68764* (2013.01); *H01L 21/68771* (2013.01); *H01L 21/68785* (2013.01); *H01L 21/68792* (2013.01)

(58) Field of Classification Search
CPC ... H02K 49/104; H02K 49/106; H02K 49/108
See application file for complete search history.

(56) References Cited

U.S. PATENT DOCUMENTS

| | | | | |
|---|---|---|---|---|
| 2010/0289200 | A1* | 11/2010 | Fukui ..................... | H02K 55/02 269/8 |
| 2016/0122872 | A1* | 5/2016 | Kato ....................... | C23C 16/52 427/8 |
| 2017/0028547 | A1* | 2/2017 | Kodama ............... | H02K 49/102 |
| 2017/0218514 | A1* | 8/2017 | Kato ................. | H01J 37/32779 |

FOREIGN PATENT DOCUMENTS

JP 201754880 A 3/2017

* cited by examiner

*Primary Examiner* — Joseph A Miller, Jr.
(74) *Attorney, Agent, or Firm* — Nath, Goldberg & Meyer; Jerald L. Meyer; Tanya E. Harkins

(57) ABSTRACT

A film formation apparatus includes a rotary table provided in a processing container; a mounting table mounting a substrate and revolved by rotation of the rotary table; a film formation gas supply part configured to supply a film formation gas to a region through which the mounting table passes by the rotation of the rotary table; a spinning shaft rotatably provided on a portion rotating together with the rotary table; a driven gear provided on the spinning shaft; a driving gear configured to rotate while facing a revolution orbit of the driven gear and provided along an entire circumference of the revolution orbit so as to constitute a magnetic gear mechanism with the driven gear, and a relative-distance-changing mechanism configured to change a relative distance between the revolution orbit of the driven gear and the driving gear.

9 Claims, 13 Drawing Sheets

FILM FORMATION APPARATUS

CROSS-REFERENCE TO RELATED APPLICATION

This application claims the benefit of Japanese Patent Application No. 2017-244303, filed on Dec. 20, 2017, in the Japan Patent Office, the disclosure of which is incorporated herein in its entirety by reference.

TECHNICAL FIELD

The present disclosure relates to a technique for performing a film formation processing of a substrate while causing the substrate placed on one surface side of a rotary table to revolve.

BACKGROUND

In a semiconductor device manufacturing process, Atomic Layer Deposition (ALD), for example, is performed in order to form various films for forming an etching mask or the like on a semiconductor wafer (hereinafter, referred to as a "wafer") which is a circular substrate. In order to enhance the productivity of semiconductor devices, in some cases, the ALD may be performed by an apparatus that rotates a rotary table, on which a plurality of wafers are placed, so as to revolve each wafer such that each wafer repeatedly passes through processing gas supply regions disposed to follow the diametric direction of the rotary table.

In a film formation processing in which a wafer is revolved in order to form a wiring pattern with high in-plane uniformity of the wafer, it is required to increase the uniformity of a film thickness in the circumferential direction of the wafer. However, in a film formation apparatus in which the wafer is revolved, since a processing gas is supplied along the diametric direction of the rotary table, the film thickness distribution of a film formed on the wafer tends to vary from the center side of the rotary table toward the peripheral side of the rotary table.

Thus, research has been conducted on how to rotate a wafer mounting table such that the wafer spins while the wafer is revolved by the rotary table, thereby making the film uniform in the circumferential direction of the wafer. For example, there has been known an apparatus in which the wafer mounting table is connected to a magnetic gear, which is a circular member in which N poles and S poles of magnets are alternately arranged in the circumferential direction. In this apparatus, a large number of electromagnets are arranged along the moving path of the magnetic gear which moves due to the rotation of a rotary table, and by controlling supply and cut of current to each electromagnet, the magnetic gear rotates in a contactless manner. Thus, it is possible to cause the wafer to spin while suppressing generation of particles.

Research has been conducted to configure an apparatus which does not use the electromagnets in order to suppress the influence on the wafer processing due to heat generation. The apparatus includes a magnetic gear mechanism including a driven gear composed of a permanent magnet connected to the mounting table and a driving gear composed of a permanent magnet facing the revolution orbit of the driven gear such that a wafer is caused to spin by the action of a magnetic force between the driving gear and the driven gear. Since an example of this apparatus will be described in detail in the embodiments of the present disclosure, a detailed description thereof will be omitted here.

However, the magnetic force of the permanent magnets cannot be freely changed, and the permanent magnets are demagnetized depending on an ambient temperature. Therefore, there is a concern that the spinning state of the wafer may be affected by the processing temperature of the wafer. In addition, when a strong magnetic force is constantly applied between the driven gear and the driving gear, the load on each part supporting the driven gear is increased by the magnetic force.

SUMMARY

The present disclosure has been made under these circumstances, and an aspect of the present disclosure is to provide a technique for ensuring that, in performing film formation by supplying a film formation gas to a substrate which is placed on a rotary table to revolve, the substrate is reliably spun, and for suppressing a load applied to each part of the apparatus by a mechanism for performing the spinning.

According to one embodiment of the present disclosure, there is provided a film formation apparatus including: a rotary table provided in a processing container; a mounting table configured to mount a substrate on one surface of the rotary table and revolved by rotation of the rotary table; a heating part configured to heat the substrate mounted on the mounting table; a film formation gas supply part configured to supply a film formation gas to a region through which the mounting table passes by the rotation of the rotary table so as to form a film on the substrate; a spinning shaft rotatably provided on a portion rotating together with the rotary table so as to support the mounting table; a driven gear provided on the spinning shaft; a driving gear configured to rotate while facing a revolution orbit of the driven gear and provided along an entire circumference of the revolution orbit so as to constitute a magnetic gear mechanism with the driven gear, and a relative-distance-changing mechanism configured to change a relative distance between the revolution orbit of the driven gear and the driving gear.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
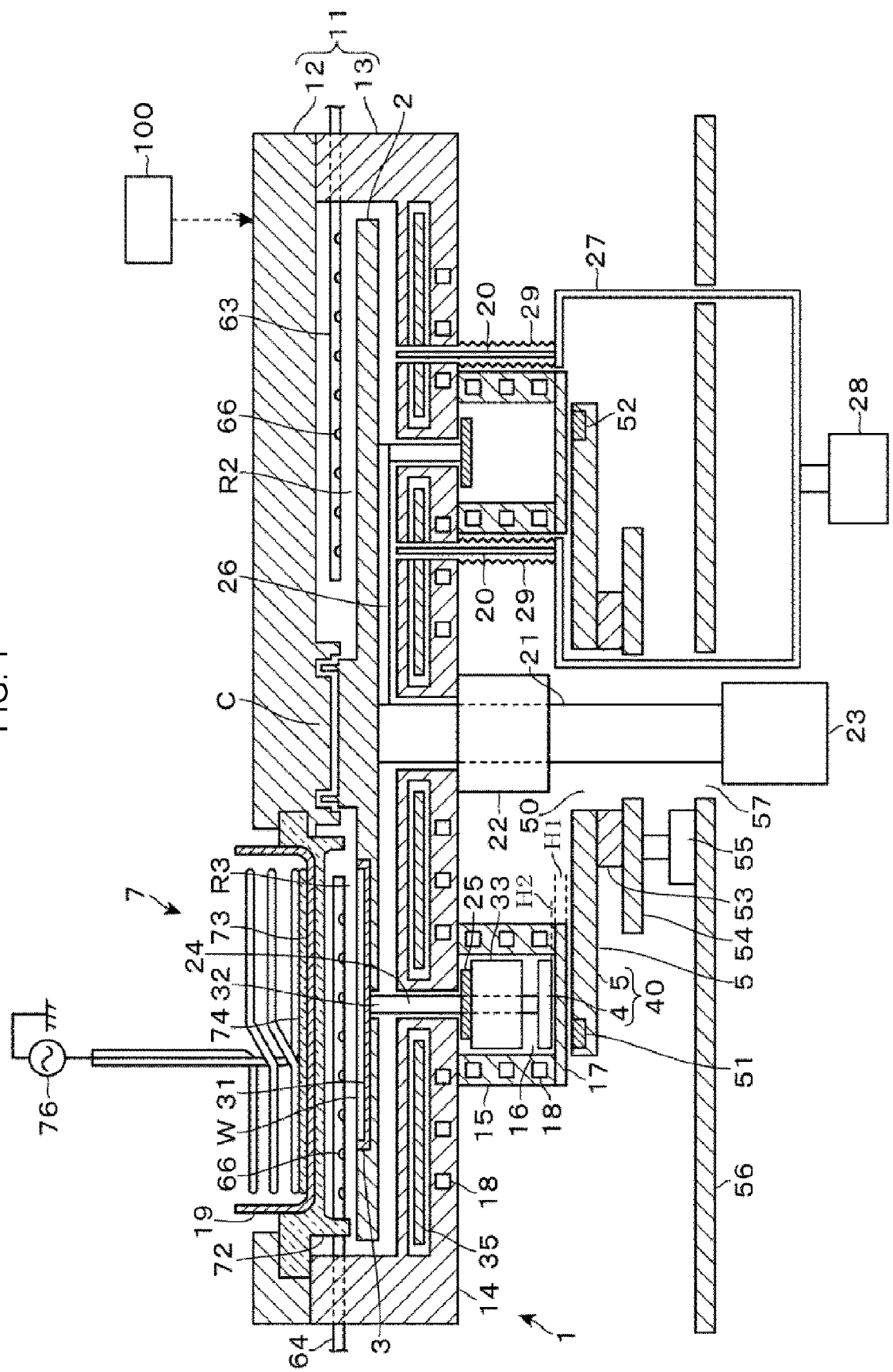
FIG. 1 is a vertical cross-sectional view of a film formation apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film formation apparatus 1 according to an embodiment of the present disclosure will be described with reference to a vertical cross-sectional view of FIG. 1 and a horizontal cross-sectional view of FIG. 2. The film formation apparatus 1 is configured to perform ALD in which a raw material gas containing silicon (Si) and an oxidizing gas are sequentially and repeatedly supplied to a wafer W placed on a rotary table (described later) to be revolved, so that the raw material gas and the oxidizing gas react with each other to form a silicon oxide ($SiO_2$) film.

The film formation apparatus 1 includes a vacuum container 11 which is a flat processing container having a substantially circular shape in a plan view. The vacuum container 11 includes a container body 13 forming a side wall and a bottom portion of the container, and a ceiling plate 12. In the drawings, reference numeral 2 denotes the above-mentioned rotary table provided in the vacuum container 11. The rotary table is formed in a horizontal disk shape. A rotary shaft 21 extending vertically downward is connected to the central portion of the rotary table 2. The rotary shaft 21 passes through a bearing part 22 provided in a bottom portion 14 of the container body 13 and is connected to a revolution rotary mechanism 23 provided outside the vacuum container 11. By the revolution rotary mechanism 23, the rotary table 2 is rotated, for example, clockwise in a plan view.

The bottom portion 14 of the container body 13 is provided with an annular slit 24, when viewed in a plan view, which penetrates the bottom portion 14 in the thickness direction thereof so as to surround the rotary shaft 21. A space formation portion 15, which is annular in a plan view and has a recess shape in a vertical cross section, is provided below the bottom portion 14, and the space in the recess part is partitioned from the outside of the vacuum container 11 and is evacuated by exhaust ports 36 and 37 (described later) during a film formation processing so as to be in a vacuum atmosphere. When the space is used as a driven-gear-moving space 16, a horizontal-supporting annular plate 25 is provided in the driven-gear-moving space 16 to be close to the bottom portion 14 of the container body 13. Further, the bottom portion of the space formation portion 15 is constituted by an annular horizontal plate, and this plate is used as a partition plate 17. The partition plate 17 forming a partition member is made of a material that passes magnetic force lines formed between the driven gear 4 and the driving gear 5 (described later), for example, aluminum or SUS (stainless steel). The thickness H1 of the partition plate 17 is, for example, 5 mm or less, more specifically, for example, 3 mm or less. In the drawings, reference numeral 18 denotes a coolant flow path provided in the side wall of the space formation portion 15 and the bottom portion 14.

Subsequently, a description will be made with reference to FIG. 3 which is a schematic perspective view of the structure of the rotary table 2 and each part included in the rotary table 2. Five spokes 26 extend from the upper end portion of the above-described bearing part 22 radially in a plan view, and the rotary table 2 is supported by the spokes 26. The spokes 26 are made of, for example, Inconel (registered trademark), which is an alloy, so as to have high strength and high heat resistance. The distal end portions of the spokes 26 are bent so as to face the slit 24 in the container body 13 downwards, and are connected to the upper surface of the supporting annular plate 25. Therefore, the supporting annular plate 25 is supported on the rotary shaft 21 by the spokes 26.

On the upper surface side (one surface side) of the rotary table 2, there is provided a mounting table 3, which is circular in a plan view and is revolved by the rotation of the rotary table 2. In this example, five mounting tables 3 are provided in the rotation direction of the rotary table 2. On the upper surface of each mounting table 3, a recess part 31 for accommodating and holding a wafer W horizontally is formed.

In the central portion of the lower surface side of each mounting table 3, a spinning shaft 32 supporting the mounting table 3 is provided so as to extend vertically downwards. Each spinning shaft 32 passes through the supporting annular plate 25 and also passes through one of five bearing units 33 (only four are illustrated in FIG. 3) provided to be supported on the lower surface of the supporting annular plate 25. The position where the spinning shaft 32 passes through the supporting annular plate 25 is between the spokes 26 adjacent to each other in the circumferential direction of the supporting annular plate 25. That is, on the supporting annular plate 25, the spinning shafts 32 and the spokes 26 are alternately arranged. Each bearing unit 33 is provided with a bearing surrounding the spinning shaft 32 so as to rotatably support the spinning shaft 32 and a magnetic seal configure to prevent scattering of particles from the bearing. With such a configuration, the spinning shaft 32 is provided to be capable of spinning on a portion rotating together with the rotary table 2. The spinning shaft 32 is supported by the bearing unit 33, and the bearing unit 33 is supported with respect to the rotary shaft 21 via the supporting annular plate 25 and the spoke 26.

A horizontal disk-shaped driven gear 4 is provided on the lower end portion of each spinning shaft 32 in the state in which the central axis thereof is aligned with the spinning shaft 32. Therefore, the driven gear 4 is connected to the mounting table 3 via the spinning shaft 32, and the driven gear 4 is revolved around the rotary shaft 21 of the rotary table 2 in the horizontal direction by the rotation of the rotary table 2. Further, when the driven gear 4 is rotated in the circumferential direction, each mounting table 3 spins about the spinning shaft 32. The distance H2 between the driven gear 4 and the partition plate 17 illustrated in FIG. 1 is 1 mm, for example.

Figure 4:
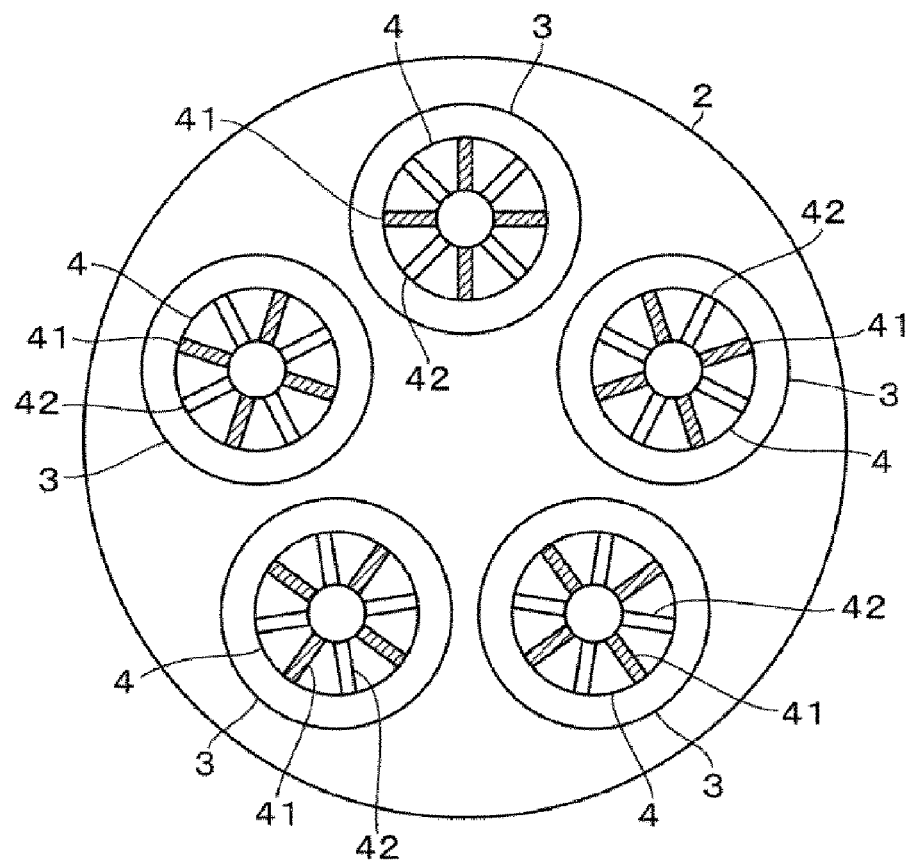
FIG. 4 is a bottom view schematically illustrating a driven gear provided on a lower surface of a mounting table.

FIG. 4 schematically illustrates the lower surface side of the driven gears 4. On the lower side of each driven gear 4, a large number of permanent magnets are buried over the entire circumference in the rotation direction of the driven gear 4. Here, the description, "the permanent magnets are provided over the entire circumference" means that the region where the permanent magnets are provided is not a partial region when viewed in the rotation direction. Therefore, even if there is a gap between the permanent magnets adjacent in the rotation direction, the permanent magnets are provided over the entire circumference, and in this example, such a gap is provided.

When the magnetic poles of the permanent magnets provided in the driven gear 4 are N pole parts 41 and S pole parts 42, the N pole parts 41 and the S pole parts 42 are alternately disposed in the spinning direction (rotation direction) when the driven gear 4 is viewed from the lower surface side. The N pole parts 41 are indicated by hatching in the drawings so as to distinguish the N pole parts from the S pole parts 42. In this example, the N pole parts 41 and the S pole parts 42 exposed on the lower surface of the driven gear 4 are each formed in the same rectangular shape, and are formed so as to radially extend horizontally from the central portion of the lower surface of the driven gear 4. For example, eighteen pole parts are arranged at intervals in the circumferential direction. The lengths of the N pole parts 41 and the S pole parts 42 are set to be, for example, shorter than the radius of the driven gear 4 so as not to exceed the center of the bottom surface of the driven gear 4. In order to suppress demagnetization under a high-temperature environment, the permanent magnets constituting the driven gear 4 and the permanent magnets constituting the driving gear 5, which will be described later, are made of, for example, samarium cobalt magnets.

Figure 3:
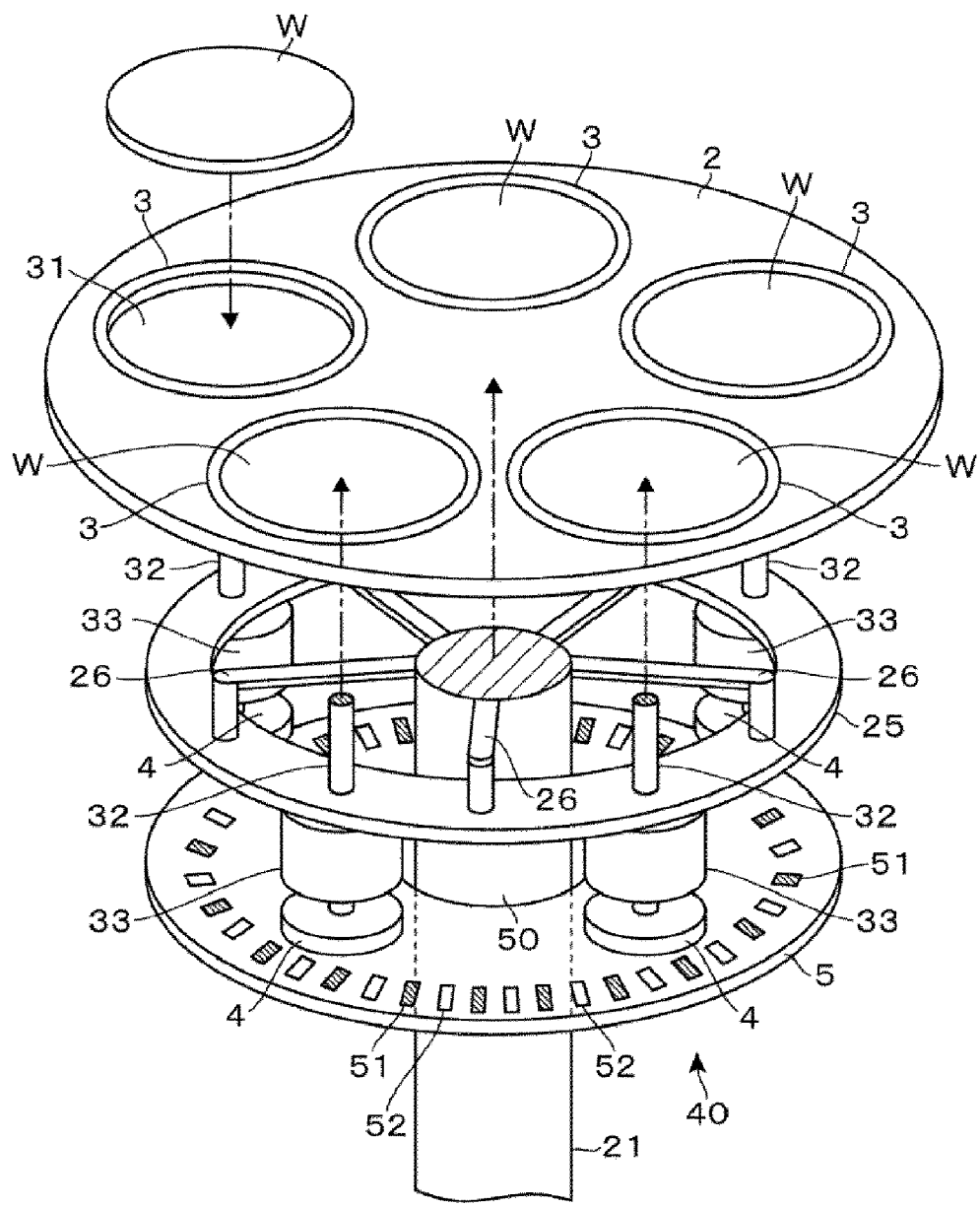
FIG. 3 is a schematic perspective view of a rotary table provided in the film formation apparatus.

As illustrated in FIG. 1 and FIG. 3, the driving gear 5 is disposed outside the vacuum container 11 (on the atmospheric atmosphere side) and below the space formation portion 15. This driving gear 5 constitutes a magnetic gear mechanism 40 with the driven gears 4. The driving gear 5 is a horizontal annular plate formed along the entire circumference of the revolution orbit of the driven gears 4, and is provided so as to face the revolution orbit. Accordingly, the upper surface of the driving gear 5 faces the lower surfaces of the driven gears 4.

In the drawings, reference numeral 50 denotes a circular opening formed in the central portion of the driving gear 5, and the center of the opening 50 coincides with the rotation center of the rotary table 2 in a plan view. As illustrated in FIG. 1, on the lower surface of the driving gear 5, a spinning rotary mechanism 53 including, for example, an annular Direct Driving motor (DD motor) for rotating the driving gear 5 is disposed so as to surround the rotary shaft 21 and the driving gear 5 is rotated about the center of the opening 50 by the spinning rotary mechanism 53. Accordingly, the driving gear 5 rotates in the state of facing the revolution orbit of the driven gears 4. The spinning rotary mechanism 53 is provided on a lifting base 54, which is circular in a plan view and surrounds the rotating shaft, and the lifting base 54 is raised and lowered by a driving-gear-lifting mechanism 55. In the drawings, reference numeral 56 denotes a horizontal floor plate, on which the driving-gear-lifting mechanism 55 is provided, and has an opening 57 through which the rotary shaft 21 passes.

Figure 5:
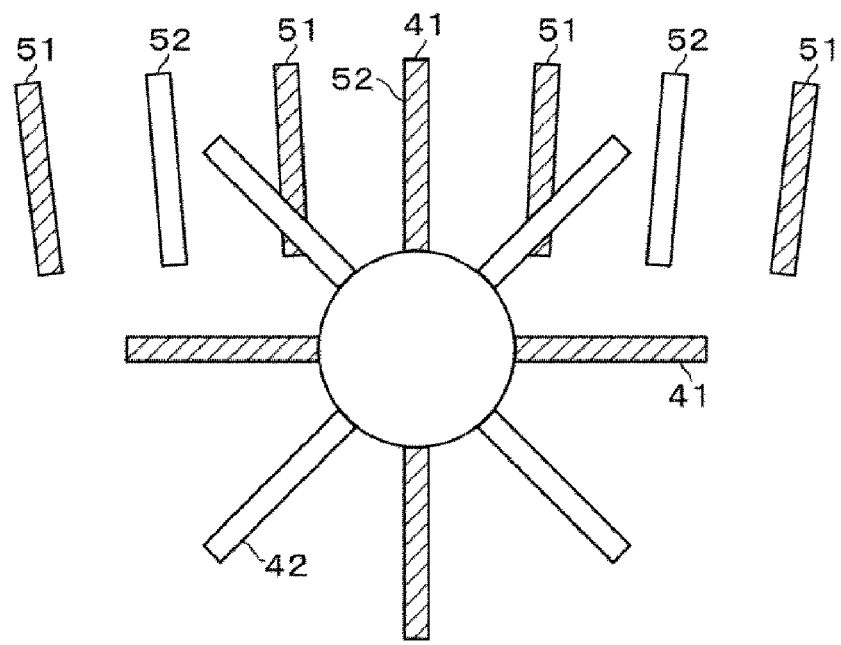
FIG. 5 is a plan view illustrating a part of a driven gear and a driving gear.

The driving gear 5 will be described in more detail. Permanent magnets are buried in the upper part of the driving gear 5 over the entire circumference of the driving gear 5 so as to face the outer peripheral edge portion of the revolution orbit of the driven gears 4. Here again, the description "the permanent magnets are provided over the entire circumference" means that the area where the permanent magnets are provided when viewed in the rotation direction of the driving gear 5 is not a partial region, and does not mean that the permanent magnets are provided in the rotation direction without a gap therebetween. In this example, such a gap is provided between permanent magnets adjacent to each other in the rotation direction. When the magnetic poles of the permanent magnets provided in the driving gear 5 are N pole parts 51 and S pole parts 52, the N pole parts 51 and the S pole parts 52 are alternately disposed in the rotation direction of the driving gear 5 when the driving gear 5 is viewed from the upper side. In FIG. 3 and FIG. 5 to be described later, the N pole parts 51 are also hatched in the drawings like the N pole parts 41 of the driving gear 5.

FIG. 5 illustrates the magnetic pole parts (the N pole parts 41 and the S pole parts 42) of one driven gear 4 and the magnetic pole parts (the N pole parts 51 and the S pole parts 52) of the driving gear 5 provided below the driven gear 4, which are associated with each other. For example, the N pole parts 51 and the S pole parts 52 are formed in a rectangular shape so as to overlap the shape of the N pole parts 41 and the S pole parts 42 formed on the lower surface of the driven gear 4. FIG. 5 illustrates the state in which the N pole parts 41 of the driven gear 4 and the S pole parts 52 of the driving gear 5 overlap each other. Since FIG. 5 and FIGS. 6 and 7 to be described later are schematic views for explaining the configuration of the magnetic gear, the number of the magnetic pole parts is different from the number of the magnetic pole parts in an actual device.

Figure 6:
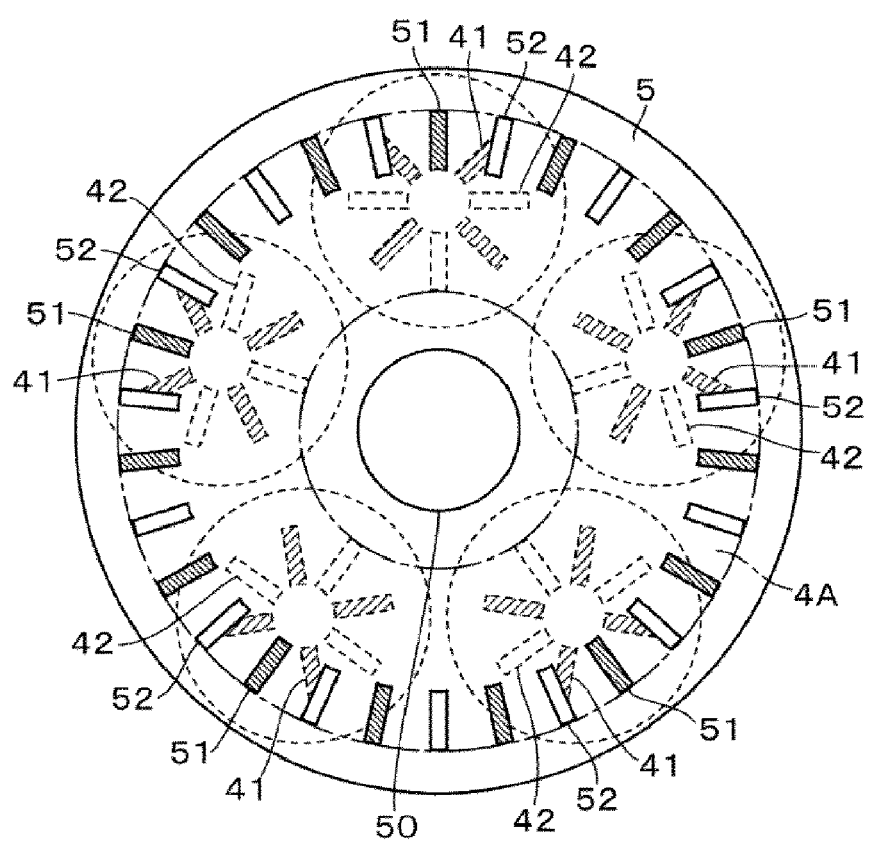
FIG. 6 is a plan view schematically illustrating a driven gear and a driving gear.
Figure 7:
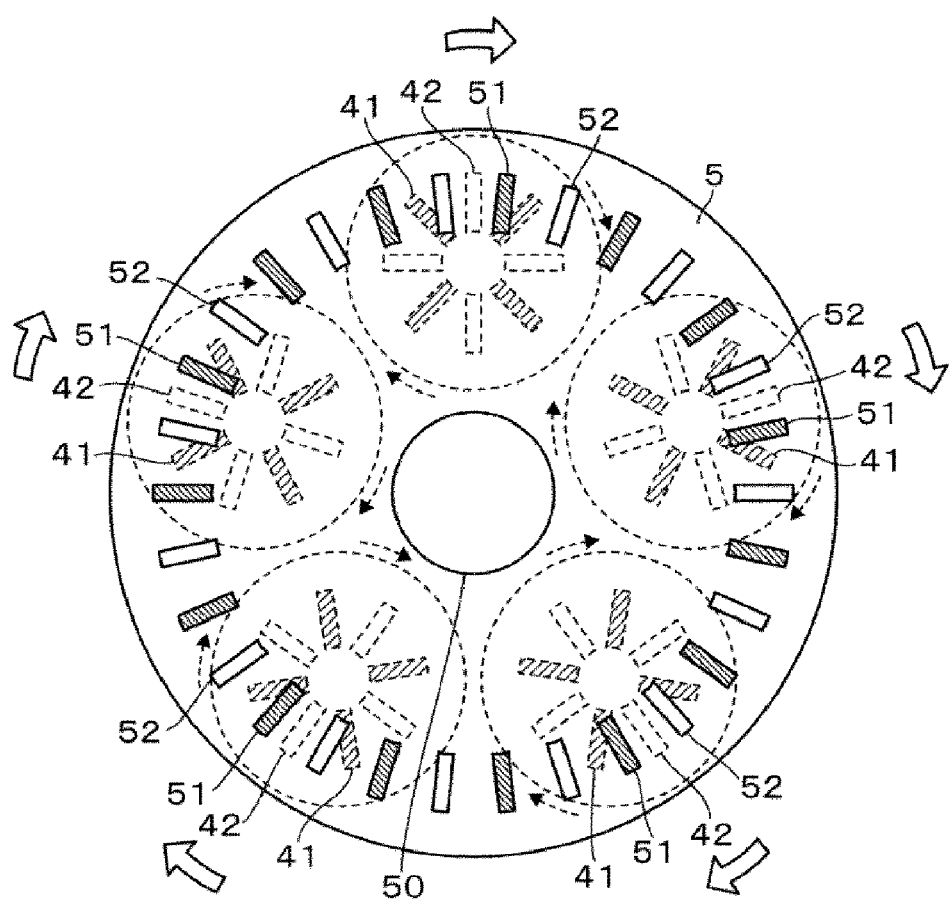
FIG. 7 is a plan view schematically illustrating a driven gear and a driving gear.

Next, the revolution and spinning of the mounting tables 3 will be described. FIG. 6 illustrates the state in which a part of five driven gears 4 is stopped facing the driving gear 5 in the state in which each of the rotary table 2 and the driving gear 5 is stopped (in the state in which they are not rotating). Each driven gear 4 is stopped at a position determined by the total action of the attractive force and the repulsive force between the respective magnetic pole parts (the N pole parts 41 and the S pole parts 42) of the driven gear 4 and the respective magnetic pole parts (the N pole parts 51 and the S pole parts 52) of the driving gear 5. Therefore, when the rotary table 2 and the driving gear 5 are rotated at the same number of revolutions (rotation velocity: rpm), since the driven gear 4 is stopped relative to the driving gear 5, the driven gear 4, i.e. the mounting table 3 is stopped without spinning.

When a difference in the rotation velocity occurs between the driving gear 5 and the rotary table 2, that is, when a velocity difference occurs between the angular velocity of the driving gear 5 and the angular velocity of the driven gear 4 (so-called revolution angular velocity) resulting from the rotation of the rotary table 2, the mounting table 3 spins. When the angular velocity Va of the driving gear 5 is larger than the angular velocity Vb of the driven gear 4 (when the velocity difference obtained by subtracting the angular velocity of the driven gear 4 from the angular velocity of the driving gear 5 is positive), the arrangement of the N pole parts 51 and the S pole parts 52 of the driving gear 5 moves from the left side to the right side in FIG. 5 below the arrangement of the N pole parts 41 and the S pole parts 42 of the driven gear 4, which faces the driving gear 5. Therefore, the repulsive force and the attractive force from the driving gear 5 acting on the driven gear 4 move to the right side, and thus the arrangement of the N pole parts 41 and the S pole parts 42 of the driven gear 4 is also drawn to the right side. As a result, the driven gear 4 spins rightward in FIG. 5, that is, in the clockwise direction from the state illustrated in FIG. 6 to the state illustrated in FIG. 7. In FIG. 6, the ring-shaped revolution orbital of the driven gears 4 is indicated by 4A.

When the angular velocity Va of the driving gear 5 is smaller than the angular velocity Vb of the driven gear 4 (when the velocity difference obtained by subtracting the angular velocity of the driven gear 4 from the angular velocity of the driving gear 5 is negative), the arrangement of the N pole parts 51 and the S pole parts 52 of the driving gear 5 moves from the right side to the left side in FIG. 5 below the arrangement of the N pole parts 41 and the S pole parts 42 of the driven gear 4, which faces the driving gear 5. Therefore, the repulsive force and the attractive force from the driving gear 5 acting on the driven gear 4 move to the left side, and as a result, the arrangement of the N pole parts 41 and the S pole parts 42 of the driven gear 4 is also drawn to the left side. As a result, the driven gear 4 spins leftward in FIG. 5, that is, in the counterclockwise direction.

Figure 8:
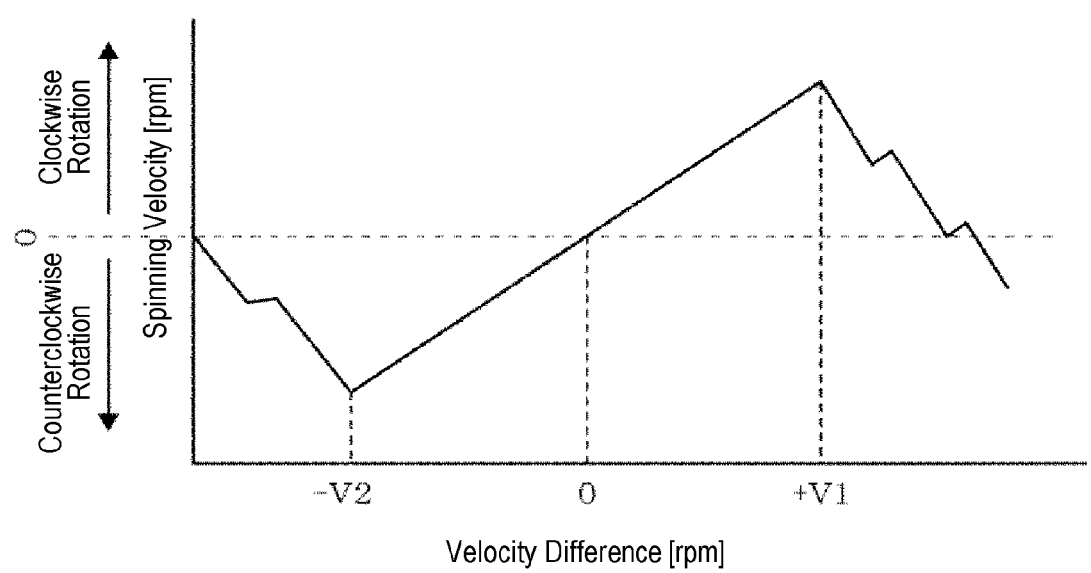
FIG. 8 is a characteristic diagram illustrating a relationship between a velocity difference between an angular velocity of a driven gear and an angular velocity of a driving gear and a spinning velocity of the driven gear.

The velocity difference between the angular velocity resulting from the revolution of the driven gear 4 and the angular velocity of the driving gear 5 and the spinning velocity of the driven gear 4 maintain a substantially proportional relationship in a certain range in which a velocity difference is present as illustrated in FIG. 8. In FIG. 8, the horizontal axis represents a velocity difference (Va−Vb) between the angular velocity Va of the driving gear 5 and the angular velocity Vb resulting from the revolution of the driven gear 4, and the vertical axis represents a spinning velocity of the driven gear 4. When the velocity difference is positive ((Va−Vb)>0), the rightward spinning velocity increases as the velocity difference increases from 0 to +V1. When the velocity difference is negative ((Va−Vb)<0), the leftward spinning velocity increases as the velocity difference increases from 0 to −V2. For example, the angular velocity of the driving gear 5 is set up to a value at which the velocity difference and the spinning velocity of the driven gear 4 maintain a substantially proportional relationship.

As described above, the mounting table 3 spins when there is a difference in the number of rotations between the driving gear 5 and the rotary table 2. The spinning velocity at this time is obtained by multiplying a difference in the rotation velocity by the gear ratio between the driving gear 5 and the driven gear 4. The rotation velocity difference is a velocity difference between the angular velocity of the driving gear 5 and the angular velocity of the driven gear 4 (so-called revolution angular velocity) resulting from the rotation of the rotary table 2. In the case where the driving gear 5 is constituted by 300 magnetic pole parts (N pole parts 51 and S pole parts 52) and the driven gear 4 is constituted by 18 magnetic pole parts (N pole parts 41 and S pole parts 42), when the number of revolutions of the rotary table 2 is 30 rpm, the spinning velocity when advancing the driving gear 5 by 0.1 degrees/second (6 degrees/minute) is obtained as follows. Since the gear ratio is 300/18=16.67 and the rotation velocity difference is 6/360 rpm, the spinning velocity of the driven gear 4 is 300/18× 6/360=0.278 rpm (100 degrees/min) based on the gear ratio×the rotation velocity difference.

The relationship between the spinning velocity of the driven gear 4 and the velocity difference between the angular velocity (revolution velocity) resulting from the revolution of the driven gear 4 and the angular velocity of the driving gear 5 as illustrated in FIG. 8 is stored in the memory of the controller 100. When performing the maintenance of, for example, a film formation processing or apparatus, the user of the film formation apparatus 1 inputs the spinning velocity of the driven gear 4 and the number of revolutions of the rotary table 2 from the input part 104 of the controller 100, and based on the input parameters and the above-mentioned relationships stored in the memory, the number of revolutions of the driving gear 5 is determined, and the driving gear 5 can be rotated at the determined number of rotations.

Figure 9:
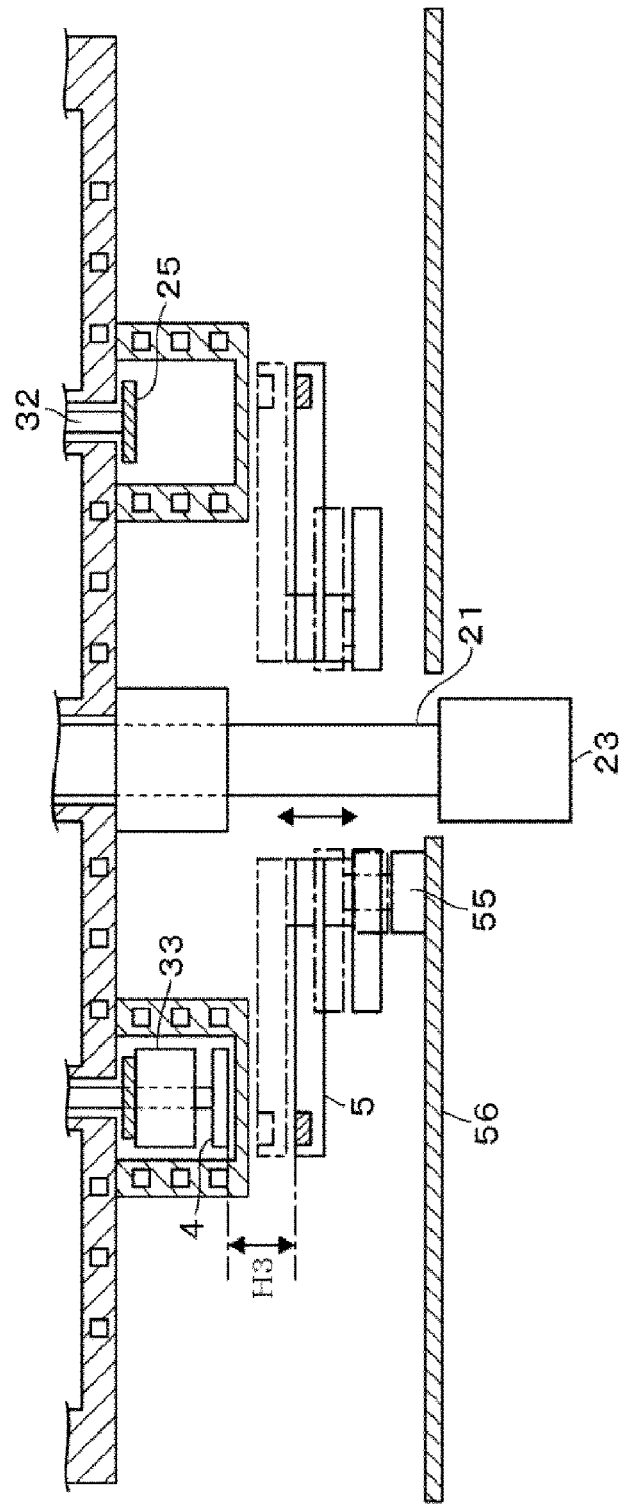
FIG. 9 is an explanatory illustrating raising and lowering of a driving gear.

The driving gear 5 is raised and lowered by the driving-gear-lifting mechanism 55, which is a relative-distance-changing mechanism, as illustrated in FIG. 9. Thus, it is possible to perform a processing on a wafer W by changing a separation distance H3 between the driving gear 5 and the revolution orbit of the driven gear 4. The separation distance H3 is changed within a range of 1 mm to 5 mm, for example. The reason for configuring the apparatus such that the separation distance H3 can be changed in this manner will be described. As described above, the driven gear 4 and the driving gear 5 are constituted by permanent magnets, and the permanent magnets are demagnetized depending on the ambient temperature. Therefore, the driven gear 4 can spin at, for example, about a room temperature without any problem by the rotation of the driving gear 5 as described with reference to FIG. 7. However, when the processing temperature of the wafer W is set to be relatively high and thus the ambient temperature of the driven gear 4 and the driving gear 5 becomes relatively high, there is a possibility that the driven gear 4 will not spin due to the demagnetization. In addition, as the number of revolutions of the rotary table 2, that is, the revolution velocity of the spinning shaft 32 becomes higher, the centrifugal force applied to the spinning shaft 32 becomes larger, and the spinning shaft 32 presses a portion of the bearing forming an inner peripheral wall of the bearing unit 33 which is outermost in a radial direction from the center of the rotary table 2, whereby the load applied to the portion is increased. That is, the minimum necessary torque for rotating the spinning shaft 32 varies depending on the number of revolutions of the rotary table 2.

Thus, it may be conceivable to make the magnetic force between the driven gear 4 and the driving gear 5 relatively strong so as to obtain the torque necessary for spinning even when the rotation velocity of the rotary table 2 is high. However, when a strong magnetic force is constantly applied between the driven gear 4 and the driving gear 5, since the magnetic pole parts (the N pole parts 51 and the S pole parts 52) of the driving gear 5 are provided to face the peripheral edge portion side of the revolution orbit of the driven gear 4, the spinning shaft 32 presses the portion of the bearing of the bearing unit 33 that is outermost in a radial direction from the center of the rotary table 2 due to the action of the magnetic force, and thus the load on this portion is increased. In addition, as the spinning shaft 32 and the mounting table 3 are strongly drawn downwards by the magnetic force, the load on the rotary table 2 increases and the load on the rotary shaft 21 increases. That is, there is a possibility that the time when the rotary table 2, the rotary shaft 21, and the bearing unit 33 are damaged may become earlier. Therefore, in the film formation apparatus 1, by adjusting the separation distance H3, the magnetic force between the driving gear 5 and the driven gear 4 can be made necessary and appropriate.

Returning to FIG. 1 and FIG. 2, the description of the film formation apparatus 1 will be continued. Reference numeral C in the drawings denotes a central region formation part having a circular shape in a plan view and is provided in the central portion of the lower surface of the ceiling plate 12 of the vacuum container 11. In the drawings, reference numeral 34 denotes protruding portions having a fan shape in a plan view and formed to be widened from the central region formation part C toward the outer side of the rotary table 2. Two protruding portions are provided to be spaced apart from each other in the circumferential direction of the rotary table 2. The central region formation part C and the protruding portion 34 form a ceiling surface that is lower than the outer region thereof. By supplying $N_2$ gas from a supply path (not illustrated) to gaps of the central region formation part C and the central portion of the rotary table 2, the contact between the raw material gas and the oxidizing gas in the central portion of the rotary table 2 is suppressed.

A heater 35 is buried in the bottom portion 14 of the container body 13 to heat the wafer W. Exhaust ports 36 and 37 are opened outside the rotary table 2 in the bottom portion 14, and are connected to a vacuum exhaust mechanism (not illustrated) constituted with a vacuum pump or the like. Further, a loading/unloading part 39 of a wafer W, which can be opened and closed by a gate valve 38, is formed, in the side wall surface of the vacuum container 11, and a substrate is transported into and out of the vacuum container 11 by a transport mechanism (not illustrated) via the loading/unloading part 39.

Three lifting pins 20 are provided in the bottom portion 14 of the vacuum container 11 in the vicinity of the loading/unloading part 39 in order to deliver the wafer W between the transport mechanism of the wafer W and the mounting table 3. However, FIG. 1 illustrates only two lifting pins 20 for convenience. Although not illustrated, a through hole is formed in the bottom portion of the mounting table 3 so that the lifting pins 20 pass through the through holes so as to deliver the wafer W. The lower ends of the lifting pins 20 are configured not to interfere with, for example, the driving gear 5, which is raised, lowered, and rotated, and are supported by an arm 27, which can be raised and lowered by the lifting mechanism 28. Reference numeral 29 in the drawings denotes a bellows that surrounds the lifting pins 20 and serves to maintain airtightness in the vacuum container 11.

Above the rotary table 2, a raw material gas nozzle 61, a separation gas nozzle 62, an oxidizing gas nozzle 63, a modifying gas nozzle 64, and a separation gas nozzle 65 are arranged in this order to be spaced apart from each other in the rotation direction of the rotary table 2. Each of the gas nozzles 61 to 65 is formed in a rod shape that extends horizontally in the radial direction of the rotary table 2 toward the central portion from the side wall of the vacuum container 11, and discharges various gases downwards from a plurality of discharge holes 66 formed to be spaced apart from each other in the longitudinal direction thereof.

The raw material gas nozzle 61 discharges BisTertial ButylAmino Silane (BTBAS) gas as a raw material gas. Reference numeral 67 in the drawings denotes a nozzle cover that covers the raw material gas nozzle 61, in which the nozzle cover serves to increase the concentration of the BTBAS gas in the region below the nozzle cover. The oxidizing gas nozzle 63 discharges ozone ($O_3$) gas as an oxidizing gas. The separation gas nozzles 62 and 65 discharge $N_2$ gas, and are disposed at positions of dividing the protruding portions 34 of the ceiling plate 12 in the circumferential direction in a plan view. The modifying gas nozzle 64 discharges a modifying gas composed of, for example, a mixed gas of argon (Ar) gas and oxygen ($O_2$) gas. In this example, the raw material gas, the oxidizing gas, and the modifying gas correspond to processing gases, respectively, and the raw material gas nozzle 61, the oxidizing gas nozzle 63, and the modifying gas nozzle 64 correspond to processing gas supply parts, respectively.

A plasma formation part 7 is provided above the modifying gas nozzle 64 so as to close an opening 19 provided in the ceiling plate 12 of the vacuum container 11. FIG. 2 illustrates a position where the plasma formation part 7 is installed by a one-dot chain line. In the drawing, reference numeral 71 denotes a main body made of a dielectric material such as quartz, and reference numeral 72 in the drawing denotes a protrusion, which protrudes downward along the opening 19 on the lower surface of the main body 71 (see FIG. 1). The modifying gas is ejected from the modifying gas nozzle 64 into the region surrounded by the protrusion 72. An antenna 75, in which a metal wire is wound in a coil shape, is provided on the upper surface side of the main body 71 with a Faraday shield 73 and an insulating plate member 74 being interposed therebetween, and a high-frequency power source 76 is connected to the antenna 75. Reference numeral 77 in the drawing denotes a slit provided in the Faraday shield 73, in which the slit serves to direct the magnetic field components of the electromagnetic field downwards.

On the rotary table 2, the region below the raw material gas nozzle 61 is an adsorption region R1 where BTBAS gas is adsorbed, and the region below the oxidizing gas nozzle 63 is an oxidizing region R2 where BTBAS gas is oxidized. In addition, the region below the plasma formation part 7 is a modifying region R3 where a $SiO_2$ film is modified by plasma. The regions below the protruding portions 34 are separation regions D1 and D2 for separating the atmosphere of the adsorption region R1 and the atmosphere of the oxidizing region R2 from each other by $N_2$ gas ejected from each of the separation gas nozzles 62 and 65.

The exhaust port 36 is opened to the outside between the adsorption region R1 and the separation region D1 adjacent to the downstream side of the adsorption region R1 in the rotation direction in order to exhaust excessive BTBAS gas. The exhaust port 37 is opened to the outside in the vicinity of the boundary between the modifying region R3 and the separation region D2 adjacent to the downstream side of the adsorption region R3 in the rotation direction in order to exhaust excessive $O_3$ gas and the modifying gas. From the exhaust ports 36 and 37, $N_2$ gas supplied from each of the respective separation regions D1 and D2 and the central region formation portion C of the rotary table 3 is also exhausted.

Figure 10:
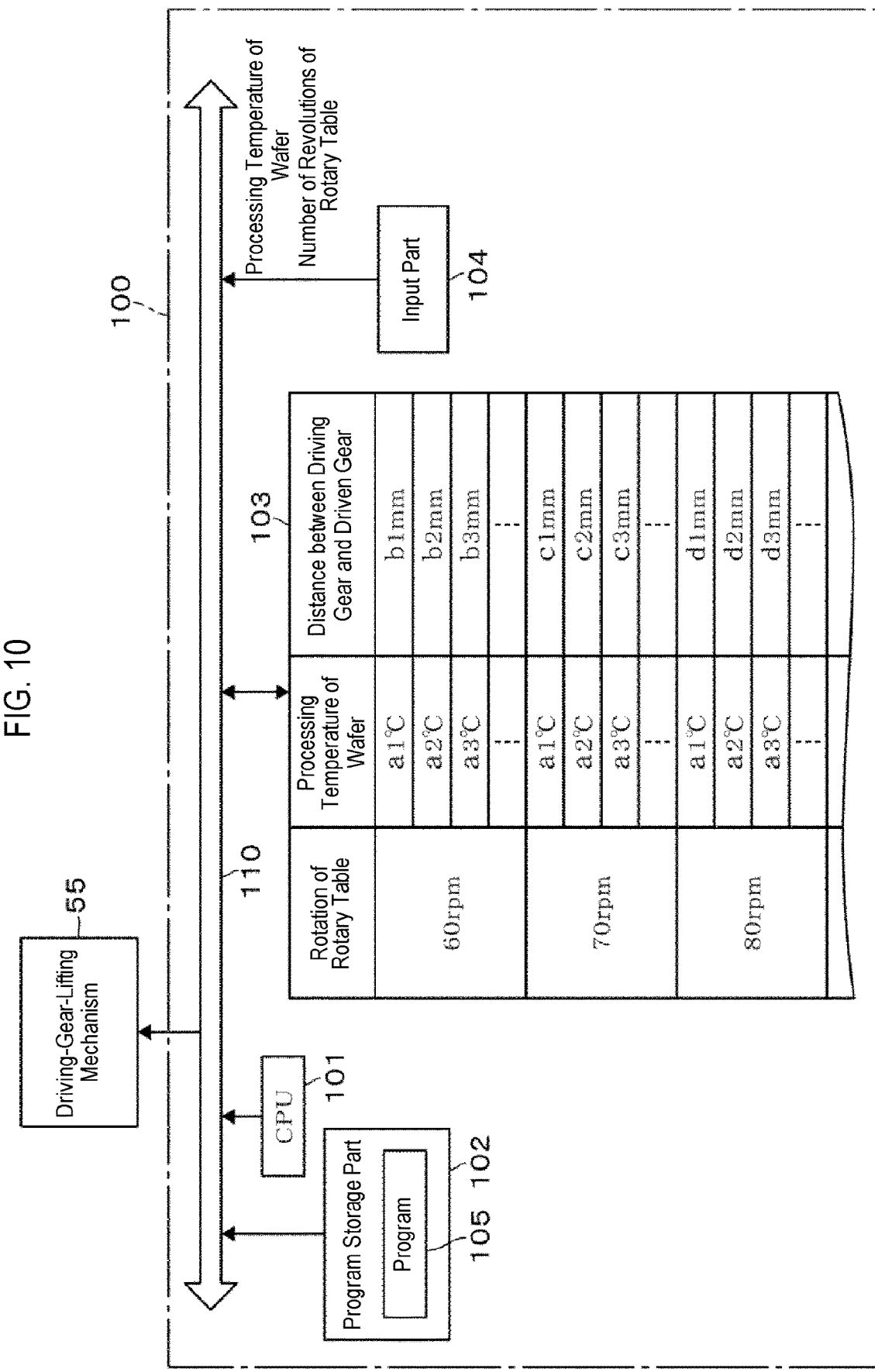
FIG. 10 is a configuration view illustrating an example of a controller provided in a film formation apparatus.

The film formation apparatus 1 is provided with a controller 100 constituted with a computer so as to perform control of the operations of the entire apparatus. FIG. 10 illustrates the schematic configuration of the controller 100. The controller 100 includes a CPU 101, a program storage part 102 that stores a program 105 that executes an operation related to a film formation processing to be described later, a storage part 103, and an input part 104. Reference numeral 110 in the drawing denotes a bus.

The storage part 103 stores the correspondence of the number of revolutions of the rotary table 2, the processing temperature of a wafer W, and the separation distance H3 between the driving gear 5 and the driven gear 4. The input part 104 is a device for inputting and setting the number of revolutions of the rotary table 2 and the processing temperature of the wafer W at the time of film formation processing as a processing recipe of the film formation apparatus 1 by the user of the film formation apparatus 1. The input part 104 is constituted with, for example, a touch panel. The separation distance H3 corresponding to the number of revolutions of the rotary table 2 and the processing temperature of the wafer W input as described above is read out from the storage part 103 and the height of the driving gear 5 is controlled by the driving-gear-lifting mechanism 55 to be the read-out separation distance H3. Then, the film formation processing is performed.

In the case where the processing temperature of the wafer W is constant, as the number of revolutions of the rotary table 2 increases, a higher torque is required for causing the mounting table 3 to spin for the reason described above. Accordingly, the separation distance H3 is set to be smaller. For example, FIG. 10 represents the separation distance H3 values in the cases where the number of revolutions of the rotary table 2 is 60 rpm, 70 rpm, and 80 rpm and the temperature of the wafer W is a1 degrees C., as b1 mm, c1 mm, and d1 mm, respectively, in which b1>c1>d1. In addition, in the case where the number of revolutions of the rotary table 2 is constant, as the temperature of the wafer W is higher, demagnetization of the driving gear 5 and the driven gear 4 is likely to occur as described above, and thus the separation distance H3 is set to be smaller. For example, FIG. 10 represents the separation distance H3 values when the number of revolutions of the rotary table 2 is 60 rpm and the temperature of the wafer W is a1 degree C., a2 degrees C., and a3 degrees C., as b1 mm, c1 mm, and d1 mm, respectively, in which a1 degree C.<a2 degree C.<a3 degree C. and b1>c1>d1.

The program 105 transmits a control signal to each part of the film formation apparatus 1 to control the operation of each part, and includes a group of steps for executing a film formation processing to be described later. For example, the number of revolutions of the driving gear 5 by the spinning rotary mechanism 53, the number of revolutions of the rotary table 2 by the revolution rotary mechanism 23, the raising and lowering of the driving gear 5 by the driving-gear-lifting mechanism 55, the supply flow rate of each gas from each of the gas nozzles 61 to 65, the processing temperature (heating temperature) of the wafer W by the heater 35, the supply flow rate of $N_2$ gas from the central region formation part C, and the like are controlled according to the control signal. The program storage part 102 that stores the program 105 is configured by a storage medium such as a hard disk, a compact disk, a magneto-optical disk, a memory card, or a DVD, and the program 105 is installed in the controller 100 from the storage medium.

Subsequently, a film formation process performed by the film formation apparatus 1 will be described. When the user of the film formation apparatus 1 sets the number of revolutions of the rotary table 2 and the processing temperature of the wafer W from the input part 104 in the state in which the driving gear 5 is positioned at a predetermined height position, the driving gear 5 is moved to a height position where it becomes the separation distance H3 corresponding to the set number of revolutions of the rotary table 2 and the processing temperature of the wafer W as described above with reference to FIGS. 9 and 10. Subsequently, by the intermittent rotation of the rotary table 2 and the rising and lowering operation of the lifting pins 20, wafers W sequentially loaded from the outside into the vacuum container 11 by a transport mechanism (not illustrated) are delivered to the mounting tables 3. When the wafers W are placed on all the mounting tables 3, the gate valve 38 is closed, and the interior of the vacuum container 11 is evacuated from the exhaust ports 36 and 37 so as to have a vacuum atmosphere of a predetermined pressure. Then, $N_2$ gas is supplied to the rotary table 2 from the separation gas nozzles 62 and 65 and the central region formation part C. Meanwhile, the temperature of the heater 35 rises and the wafers W are heated so as to reach the set processing temperature.

Then, the rotary table 2 rotates at the set number of revolutions and, for example, the driving gear 5 is rotated at the same velocity as the rotary table 2. As a result, the mounting table 3 revolves in the state in which the spinning thereof is stopped. Next, the supply of respective gases from the raw material gas nozzle 61, the oxidizing gas nozzle 63, and the modifying gas nozzle 64, and the formation of plasma by application of high-frequency waves to the antenna 75 from the high-frequency power source 76 are initiated. Further, the number of revolutions of the driving gear 5 is changed to be different from the number of revolutions of the rotary table 2, and the mounting table 3 spins at a predetermined number of revolutions.

Figure 2:
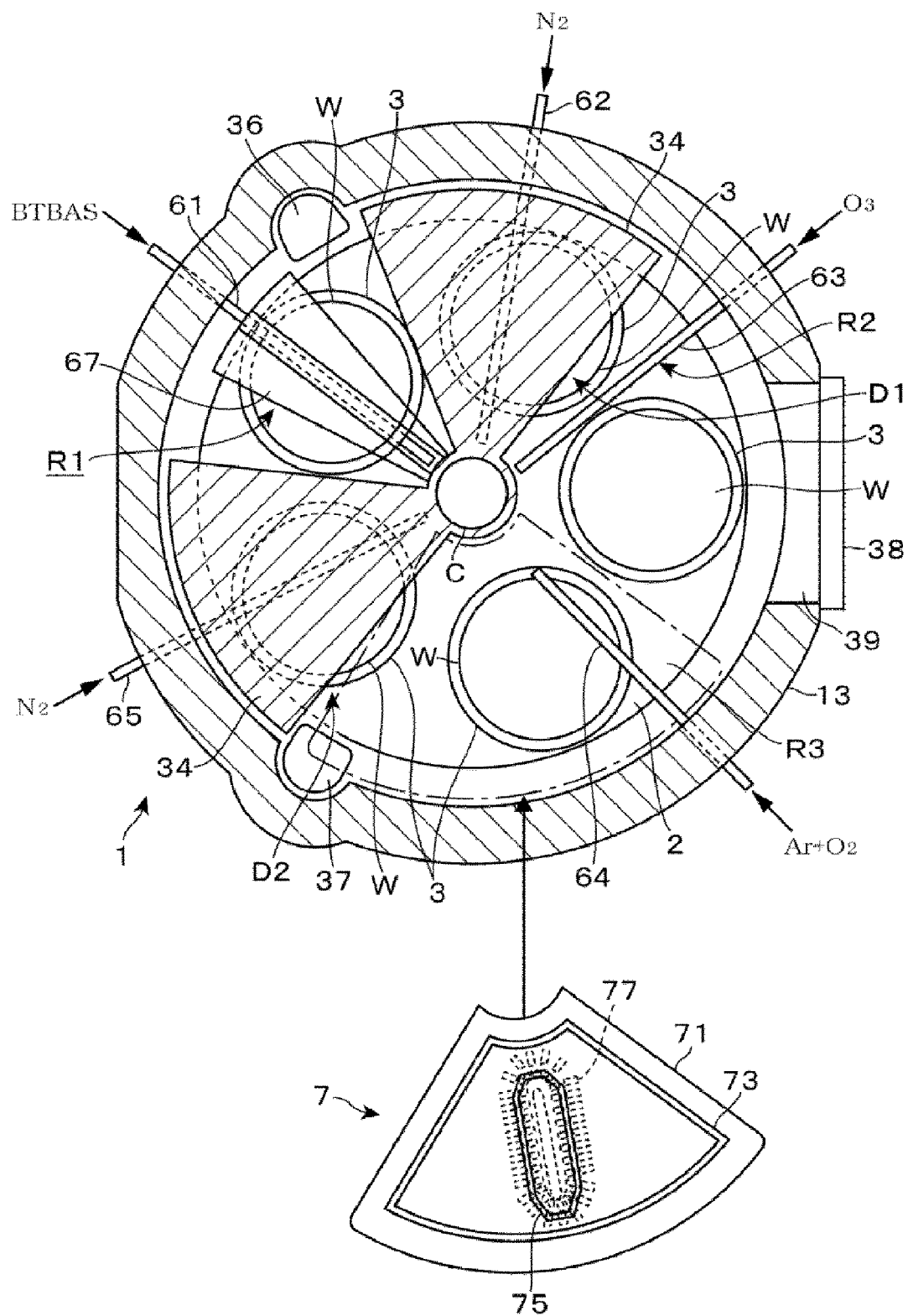
FIG. 2 is a horizontal cross-sectional view of the film formation apparatus.

As illustrated in FIG. 2, since a separation region D1, to which $N_2$ gas is supplied, is formed between the adsorption region R1 and the oxidizing region R2 in the vacuum container 11, the raw material gas supplied to the adsorption region R1, the oxidizing gas supplied to the oxidizing region R2 are exhausted without being mixed with each other on the rotary table 2. In addition, since a separation region D2, to which $N_2$ gas is supplied, is also formed between the adsorption region R1 and the modifying region R3, the raw material gas, the modifying gas supplied to the modifying region, and the oxidizing gas directed to the separation region D2 from the upstream side in the rotation direction of the modifying region R3 are exhausted from the exhaust ports 36 and 37 without being mixed with each other on the rotary table 2. The $N_2$ gas supplied from the central region formation part C is also removed from the exhaust ports 36 and 37.

Figure 11:
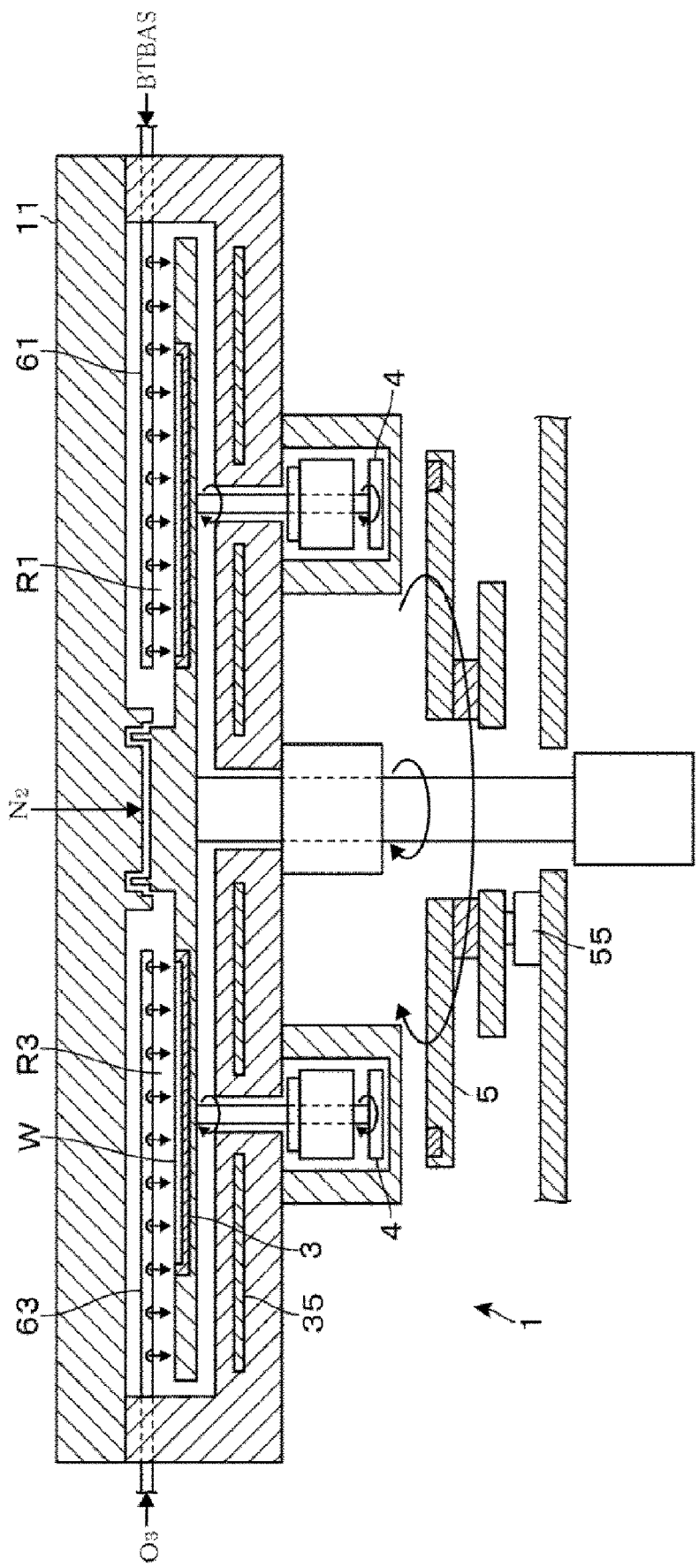
FIG. 11 is an explanatory view illustrating an operation of the film formation apparatus.

Each wafer W passes through the adsorption region R1, the oxidizing region R2, and the modifying region R3 sequentially in the state where supply and exhaust of the respective gases are performed as described above. In the adsorption region R1, the BTBAS gas ejected from the raw material gas nozzle 61 is adsorbed to the wafers W, and in the oxidizing region R2, the adsorbed BTBAS gas is oxidized by O3 gas) supplied from the oxidizing gas nozzle 63 such that one or more molecular layers of $SiO_2$ are formed. In the modifying region R3, the molecular layer of $SiO_2$ is modified by being exposed to the plasma of the modifying gas. By the rotation of the rotary table 2, the above-described cycles are repeatedly executed a plurality of times, whereby the molecular layers of $SiO_2$ are laminated, and a $SiO_2$ film is formed on the surfaces of the wafers W. FIG. 11 illustrates the operation of each part of the film formation apparatus 1 when film formation is performed in this way.

In this film formation apparatus 1, in parallel to the rotation of the rotary tables 2, the spinning of wafers W is performed by rotation of the mounting tables 3. In order to ensure that the rotation of the rotary table 2 and the rotation of the mounting tables 3 are not synchronized, the number of revolutions of the rotary table 2 and the spinning velocity of the mounting tables 3 are set. That is, the number of revolutions of the rotary table 2 and the spinning velocity of the mounting tables 3 are set such that, when the rotary table 2 is rotated once from a rotation start point in which each wafer W is oriented in a first direction, to be positioned again at the rotation start point, wafer W is oriented in a second direction different from the first direction.

As described above, since each mounting table 3 spins without being synchronized with the rotation of the rotary table 2, the wafer W on each mounting table 3 passes through the adsorption region R1 of the raw material gas in various directions by spinning and revolution thereof. In this way, with the spinning of the mounting tables 3, a cycle of forming the above-mentioned molecular layer of $SiO_2$ is executed while gradually changing the direction in a plan view. Even when the concentration distribution of the raw material gas varies, for example, in the adsorption region R1, the amount of the raw material gas adsorbed on the wafer W can be made uniform in the circumferential direction of the wafer W when viewed in the entire period in which a $SiO_2$ molecular layer formation cycle is performed a plurality of times by performing the film formation while changing the direction of the wafer W. As a result, it is possible to suppress the deviation of film thickness of a $SiO_2$ film formed on each wafer W when viewed in the circumferential direction of the wafer W.

When molecular layers of $SiO_2$ are sequentially laminated in this way and a preset number of cycles is performed, rotation of the rotary table 2, rotation of the driving gear 5, supply of various gases, formation of plasma are stopped and the film formation processing is ended. Thereafter, the wafers W are unloaded from the vacuum container 11 in a procedure reverse to that when the wafers W are loaded into the vacuum container 11.

With the film formation apparatus 1 described above, the separation distance H3 between the driven gears 4 and the driving gear 5 is adjusted by the driving-gear-lifting mechanism 55, and the magnetic force between the driving gear 5 and the driven gears 4 is adjusted. Therefore, it is possible to prevent a strong magnetic force from constantly acting between the driving gear 5 and the driven gears 4 so as to suppress the load from being applied to each component in the rotary table 2, the rotary shaft 21, etc., whereby it is possible to secure the magnetic force required for each mounting table 3 to spin during the film formation processing while suppressing consumption, deformation, and breakage of each component.

In the film formation apparatus 1, the separation distance H3 is changed by raising and lowering the driving gear 5 with respect to the driven gears 4 and the unit for revolving the driven gears 4. However, the separation distance H3 may be changed by raising and lowering the driven gears 4 with respect to the driving gear 5. Specifically, for example, by connecting the revolution rotary mechanism 23 to the lifting mechanism such that the rotary table 2 and the vacuum container 11 are raised and lowered, the driven gears 4 can be raised and lowered with respect to the driving gear 5.

In the above example, the correspondence relationship of the processing temperature of the wafers W, the number of revolutions of the rotary table 2, and the separation distance H3 is stored in the storage part 103 of the controller 100, but any one of the correspondence relationship between the processing temperature of the wafers W and the separation distance H3, and the number of revolutions of the rotary table 2 and the separation distance H3 may be stored. That is, the user of the film formation apparatus 1 may set one of the processing temperature of the wafers W and the number of revolutions of the rotary table 2, thereby setting the separation distance H3. It is not limited to changing the separation distance H3 according to the processing recipe. For example, when the above-described film formation processing is in the standby state without being performed, the driving gear 5 is positioned at a height position where the separation distance H3 becomes relatively large, and when the film formation processing is performed, the driving gear 5 may be positioned at a preset height position where the separation distance H3 is relatively small. That is, the case where the height of the driving gear 5 is uniform during respective film formation processings is also included in the scope of the present disclosure. However, in order to more reliably rotate the driven gears 4 and to suppress the load on each part of the film formation apparatus 1, it is preferable to control the height of the driving gear 5 according to the processing recipe as described above.

As described above, in the film formation apparatus 1, the revolution and spinning are performed in parallel with each other during film formation on the wafers W. The spinning of the wafers W includes intermittent spinning of the wafers W in addition to the continuous spinning of the wafer W during the rotation of the rotary table 2. In addition, the timing of the start and stop of the spinning of the wafers W may be matched to the timing of the start and stop of revolution of the wafers W, and the timing of the start and stop between the spinning and revolution of the wafers W may be deviated. Although the driving gear 5 is provided in the ambient atmosphere in the examples described above, it may be provided in a vacuum atmosphere similarly to the driven gears 4 by configuring the vacuum container 11 to surround the driving gear 5.

On the other hand, as the magnetic gear mechanism 40 including the driving gear 5 and the driven gears 4, the driven gears 4 may be configured to rotate in a contactless manner with respect to the driving gear 5 by the rotation of the driving gear 5 by the magnetic force. Accordingly, only one of the driven gears 4 and the driving gear 5 may be a magnetic body. In addition, the driven gears 4 or the driving gear 5 is not limited to the configuration in which the N pole parts and the S pole parts are alternately arranged, but may be constituted by only one of the S pole parts and the N pole parts. However, it is desirable to dispose different magnetic poles alternately in the driven gears 4 and the driving gear 5 as in the above-described embodiments since the mounting tables 3 are rotated using the repulsive force and the attractive force of the magnets, so that the mounting tables 3 can be reliably rotated. Further, as long as the driven gears 4 can be rotated by the rotation of the driving gear 5, the shape of each magnetic pole part is not limited to the rectangular shape as in the example described above.

(Evaluation Experiment)

Evaluation experiments, which were performed in connection with the present disclosure, will be described. In Evaluation Experiment 1, using an experimental apparatus having substantially the same configuration as that of the film formation apparatus 1, the average of the spinning velocities of respective wafers W placed on the rotary table 2 was investigated in the case where the number of revolutions of the rotary table 2 and the number of revolutions of the driving gear 5 were changed. In this experimental apparatus, the thickness H1 of the partition plate 17 described in FIG. 1 was set to 3 mm, the distance H2 between the partition plate 17 and the lower surface of the driven gears 4 was set to 1 mm, and the distance between the partition plate 17 and the upper surface of the driving gear 5 was set to 1 mm. Therefore, in this experimental apparatus, the separation distance H3 between the driving gear 5 and the revolution orbit of the driven gears 4 described with reference to FIG. 9 was 5 mm. The rotary table 2 was rotated at 30 rpm, 60 rpm, or 120 rpm. In addition, the number of revolutions of the driving gear 5 was changed such that the difference between the number of revolutions of the driving gear 5 and the number of revolutions of the rotary table 2 converged within the range of −0.8 degrees/second to +0.8 degrees/second.

Figure 12:
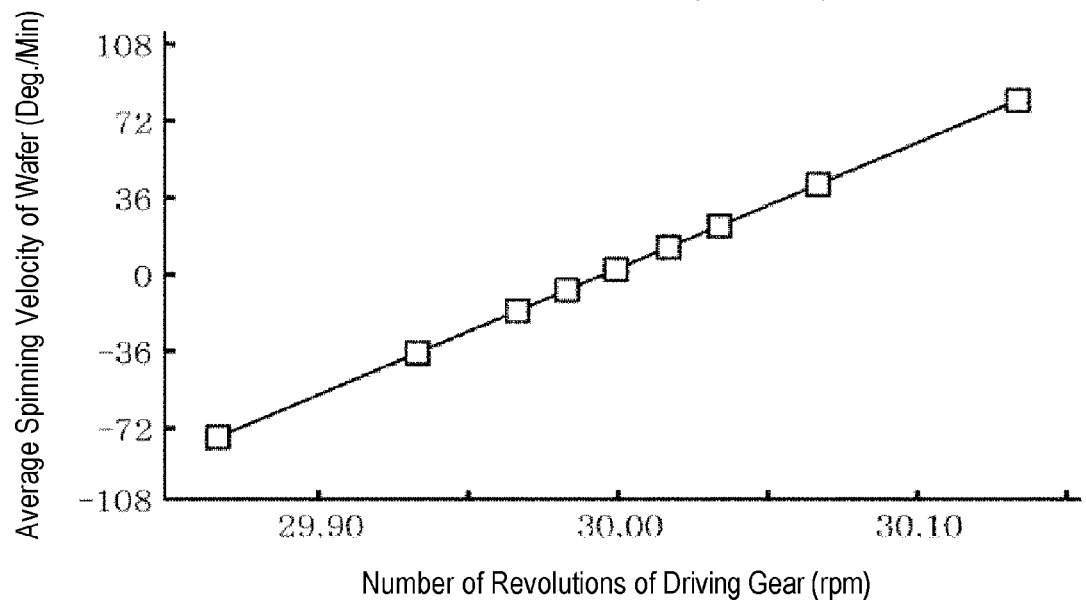
FIG. 12 is a graph representing a result of an evaluation experiment.
Figure 13:
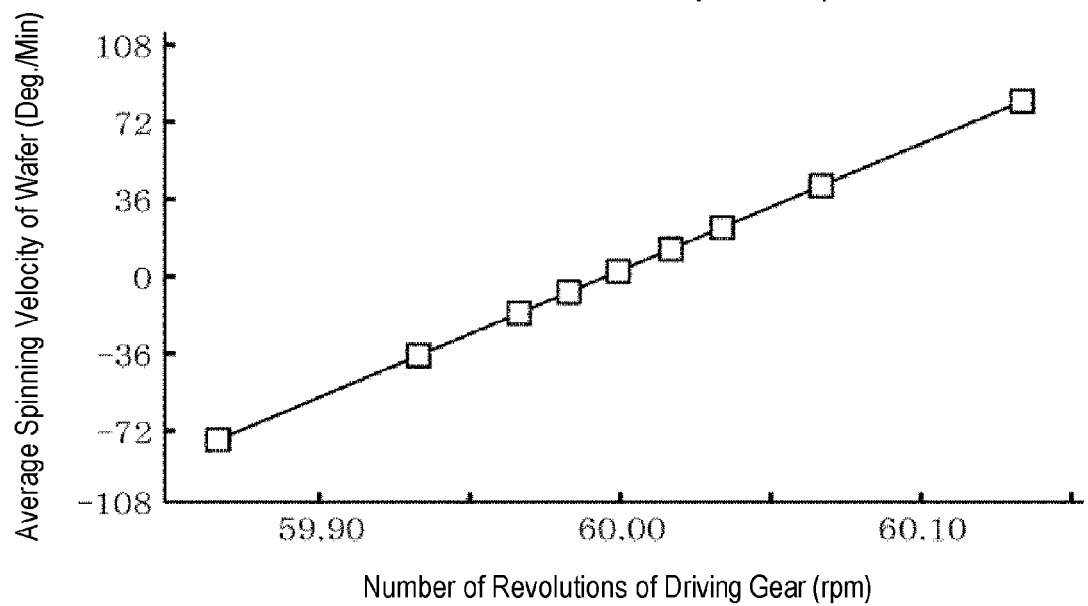
FIG. 13 is a graph representing a result of an evaluation experiment.
Figure 14:
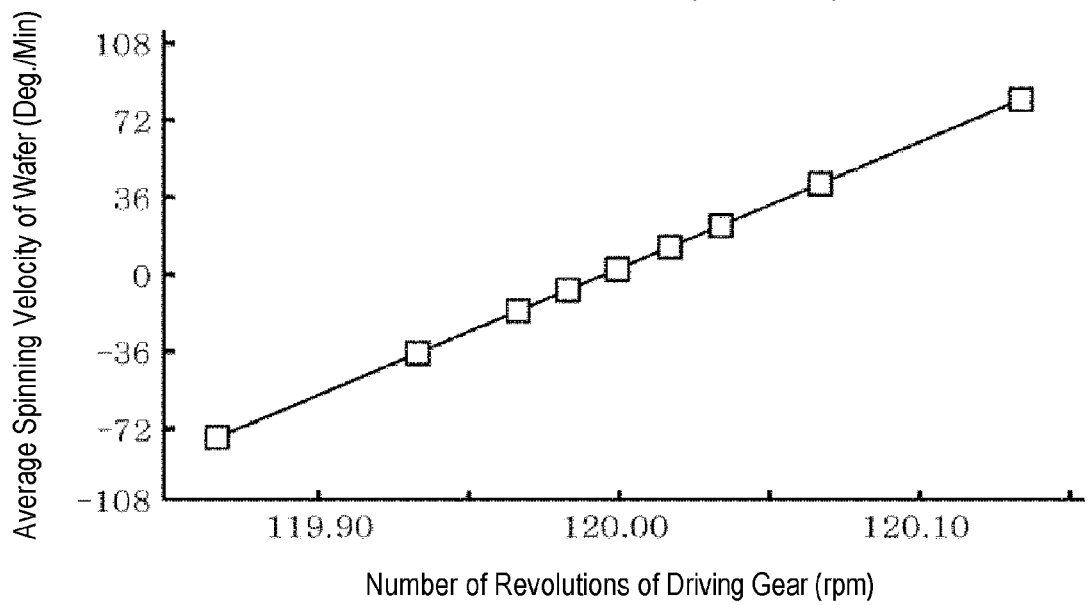
FIG. 14 is a graph representing a result of an evaluation experiment.

The graphs of FIGS. 12, 13, and 14 are graphs representing the experiment results when the number of revolutions of the rotary table 2 is 30 rpm, 60 rpm, and 120 rpm, respectively. In each graph, the horizontal axis represents the number of revolutions (unit: rpm) of the driving gear 5, and the vertical axis represents the average spinning velocity (unit: degrees/minute) of wafers W. In each graph, only results for one wafer W among five wafers W on the rotary table 2 are represented. This is because the variation of the average spinning velocity of the five wafers W was substantially zero. As represented in each graph, it was confirmed that the average spinning velocity of wafers W increases in proportion to the increase in the number of revolutions of the driving gear 5 regardless of whether the number of revolutions of the rotary table 2 is 30 rpm, 60 rpm, or 120 rpm. The negative average spinning velocity and the positive average spinning velocity means that the wafers W spin in opposite directions.

From the results of this Evaluation Experiment 1, it was confirmed that in the range where the number of revolutions of the rotary table 2 is 120 rpm or less, it is possible to control the spinning velocity and spinning direction of wafers W regardless of the revolution velocity of wafers W by the rotary table 2. In addition, it was confirmed that a magnetic force acts between the driving gear 5 and the driven gears 4 so as to be capable of rotating the driven gears 4 even when the driven gears and the driving gear are partitioned by the partition plate 17. According to the present disclosure, since the driving gear 5 is raised and lowered, so that the magnetic force between the driven gears 4 and the driving gear 5 can be adjusted. Accordingly, it is estimated that wafers W can be rotated at a desired number of revolutions even if the number of revolutions of the rotary table 2 is higher than 120 rpm.

Next, Evaluation Experiment 2 will be described. In Evaluation Experiment 2, as in Evaluation Experiment 1, the average spinning velocities of respective wafers W placed on the rotary table 2 were measured in the case where the number of revolutions of the rotary table 2 and the number of revolutions of the driving gear 5 were changed. However, as a difference, the separation distance H3 (see FIG. 9) between the driving gear 5 and the revolution orbit of the driven gears 4 was set to 9 mm. The driving gear 5 was rotated such that the spinning velocity set for each wafer W (set spinning velocity) becomes +5 rpm to −5 rpm. The number of revolutions of the rotary table 2 was set to 240 rpm, 210 rpm, 180 rpm, 150 rpm, 120 rpm, 90 rpm, 60 rpm, 30 rpm, and 2 rpm.

Figure 15:
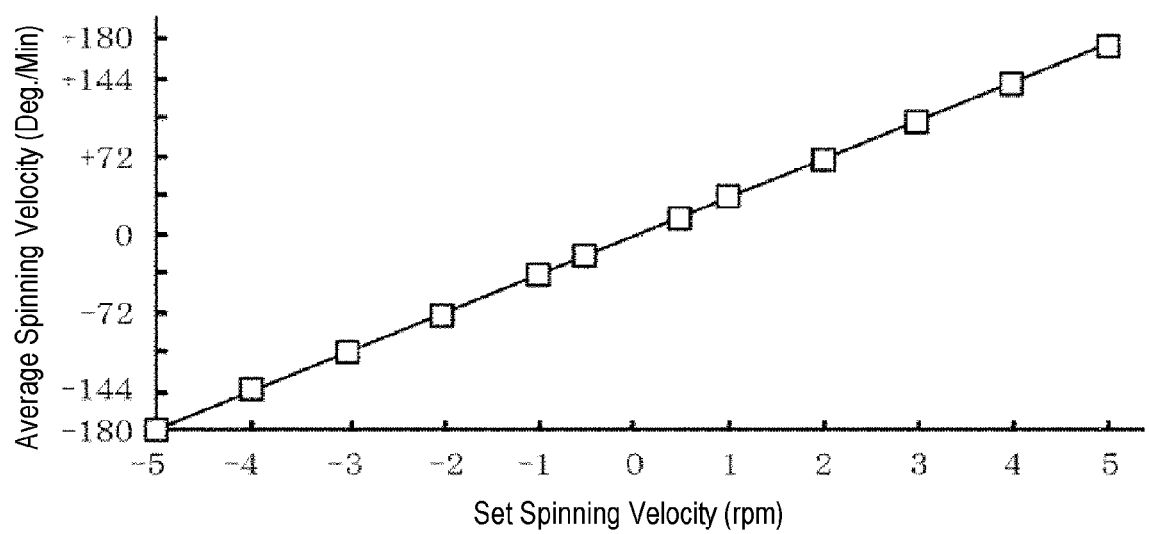
FIG. 15 is a graph representing a result of an evaluation experiment.

Among the obtained experimental results, the results obtained when the rotary table 2 was rotated at 240 rpm are represented in the graph of FIG. 15 as a representative. The vertical axis of the graph of FIG. 15 represents the average spinning velocity (unit: degrees/minute) of a wafer W similarly to the vertical axis of each of the graphs of FIGS. 12 to 14. The horizontal axis of the graph of FIG. 15 represents the set average spinning velocity of the wafer W described above. In the graph of FIG. 15, since the variation of the average spinning velocity of five wafers W on the rotary table 2 was substantially zero similarly to the results of Evaluation Experiment 1, only the result for one wafer W is illustrated. As apparent from the graph of FIG. 15, the average spinning velocity of the wafer W is a value within the range of +180 degrees/min to −180 degrees/min depending on the set spinning velocity, and the average spinning velocity of the wafer W increases in proportion to the increase of the set spinning velocity.

Although not illustrated, the waveforms of the graphs when the number of revolutions of the rotary table 2 is set to a value other than 240 rpm Evaluation Experiment 2 were approximately equal to the waveform of the graph when the number of revolutions of the rotary table 2 was set to 240 rpm. That is, as the set spinning velocity changes, the average spinning velocity of the wafer W changed within the range of +180 degrees/min to −180 degrees/min so as to obtain the set spinning velocity, and as a result, the average spinning velocity of the wafer W increased in proportion to the increase of the set spinning velocity. The variation in the average spinning velocities of the five wafers W on the rotary table 2 was also approximately zero as was the case when the number of revolutions of the rotary table 2 was set to 240 rpm.

Therefore, from the results of this Evaluation Test 2, it was confirmed that in the range where the number of revolutions of the rotary table 2 is 240 rpm or less, the spinning velocities are aligned between wafers W, and thus it is possible to control the spinning velocity and spinning direction of the wafers W. In other words, it was confirmed that it is possible to operate the above-described film formation apparatus 1 by setting the number of revolutions of the rotary table 2 within the above-mentioned range. Further, it was confirmed that it is possible to set the spinning velocity of the wafers W to +5 rpm to −5 rpm.

According to the present disclosure, a film formation apparatus includes a spinning shaft provided on a member rotating together with a rotary table to be capable of spinning so as to support a mounting table on which a substrate is placed, a driven gear provided on the rotary shaft, a driving gear configured to rotate facing a revolution orbit of the driven gear and provided along the entire circumference of the revolution orbit so as to configure a magnetic gear mechanism with the driven gear, and a relative-distance-changing mechanism configured to change a relative distance between the revolution orbit of the driven gear and the driving gear. Thus, it possible to make a magnetic force acting between the driven gear and the driving gear during the film formation processing necessary for performing spinning of a substrate, and to prevent the magnetic force from becoming strong constantly, thereby suppressing a burden from being applied to each part of the apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A film formation apparatus comprising:
a rotary table provided in a processing container;
a mounting table configured to mount a substrate on one surface of the rotary table and revolved by rotation of the rotary table;
a heating part configured to heat the substrate mounted on the mounting table;
a film formation gas supply part configured to supply a film formation gas to a region through which the mounting table passes by the rotation of the rotary table so as to form a film on the substrate;
a spinning shaft rotatably provided on a member rotating together with the rotary table so as to support the mounting table;

a driven gear provided on the spinning shaft and configured to be revolved along a revolution orbit by rotation of the rotary table;

a driving gear configured to rotate while facing the revolution orbit of the driven gear and extending along an entire circumference of the revolution orbit of the driven gear so as to constitute a magnetic gear mechanism with the driven gear, and a relative-distance-changing mechanism configured to raise and lower at least one of the driven gear and the driving gear so as to change a relative distance between the revolution orbit of the driven gear and the driving gear, wherein the driving gear is a horizontal annular plate formed along the entire circumference of the revolution orbit of the driven gear.

2. The film formation apparatus of claim 1, wherein the relative-distance-changing mechanism is a lifting mechanism that raises and lowers the driving gear with respect to the revolution orbit of the driven gear in a lateral direction.

3. The film formation apparatus of claim 1, wherein the driven gear has N pole parts and S pole parts alternately arranged in a rotation direction over an entire circumference thereof, and the driving gear has N pole parts and S pole parts alternately arranged over an entire circumference thereof along the revolution orbit.

4. The film formation apparatus of claim 1, wherein each of the driven gear and the driving gear has magnetic pole parts constituted with permanent magnets.

5. The film formation apparatus of claim 1, wherein respective magnetic pole parts of the driven gear are provided on a lower surface of the driven gear to extend radially in a lateral direction from a central portion of the lower surface, and respective magnetic pole parts of the driving gear are arranged on a surface facing the lower surface of the driven gear.

6. The film formation apparatus of claim 1, wherein an interior of the processing container is configured to be in a vacuum atmosphere, the driving gear is provided in an atmospheric atmosphere, and a partitioning member made of a material that passes a magnetic force line is provided between the driven gear and the driving gear to partition the atmospheric atmosphere and the vacuum atmosphere.

7. The film formation apparatus of claim 1, wherein the relative distance between the revolution orbit of the driven gear and the driving gear is changed according to a processing recipe of the substrate.

8. The film formation apparatus of claim 7, wherein the processing recipe includes at least one of a number of revolutions of the rotary table and a processing temperature of the substrate.

9. The film formation apparatus of claim 1, further comprising a rotary shaft provided along a vertical axis, wherein the rotary table is configured to be rotated around the vertical axis, and the driven gear and the driving gear are configured to be revolved around the rotary shaft.

* * * * *